United States Patent
Su et al.

(10) Patent No.: US 9,793,239 B2
(45) Date of Patent: Oct. 17, 2017

(54) SEMICONDUCTOR WORKPIECE WITH SELECTIVE BACKSIDE METALLIZATION

(71) Applicants: Michael Z. Su, Austin, TX (US);
Michael S. Alfano, Austin, TX (US);
Bryan Black, Spicewood, TX (US)

(72) Inventors: Michael Z. Su, Austin, TX (US);
Michael S. Alfano, Austin, TX (US);
Bryan Black, Spicewood, TX (US)

(73) Assignee: Advanced Micro Devices, Inc., Sunnyvale, CA (US)

(*) Notice: Subject to any disclaimer, the term of this patent is extended or adjusted under 35 U.S.C. 154(b) by 0 days.

(21) Appl. No.: 14/865,816

(22) Filed: Sep. 25, 2015

(65) Prior Publication Data

US 2017/0092616 A1   Mar. 30, 2017

(51) Int. Cl.
| | |
|---|---|
| H01L 21/66 | (2006.01) |
| H01L 25/065 | (2006.01) |
| H01L 21/768 | (2006.01) |
| H01L 23/367 | (2006.01) |
| H01L 25/00 | (2006.01) |
| H01L 23/498 | (2006.01) |
| H01L 23/528 | (2006.01) |
| H01L 21/78 | (2006.01) |

(52) U.S. Cl.
CPC ........ *H01L 25/0652* (2013.01); *H01L 21/768* (2013.01); *H01L 21/78* (2013.01); *H01L 22/20* (2013.01); *H01L 23/3675* (2013.01); *H01L 23/49838* (2013.01); *H01L 23/528* (2013.01); *H01L 25/50* (2013.01); *H01L 2225/06589* (2013.01)

(58) Field of Classification Search
CPC ...................................................... H01L 22/20
See application file for complete search history.

(56) References Cited

U.S. PATENT DOCUMENTS

| | | |
|---|---|---|
| 5,411,921 A | 5/1995 | Negoro |
| 5,641,714 A | 6/1997 | Yamanaka |
| 6,444,310 B1 | 9/2002 | Senoo et al. |
| 6,841,414 B1 | 1/2005 | Hu et al. |
| 7,101,620 B1 | 9/2006 | Poddar et al. |
| 2002/0004288 A1 | 1/2002 | Nishiyama |
| 2004/0113283 A1 | 6/2004 | Farnworth et al. |
| 2004/0161876 A1 | 8/2004 | Tandy et al. |
| 2005/0024076 A1* | 2/2005 | Haji-Sheikh ......... G01R 31/275 324/750.05 |
| 2005/0072334 A1 | 4/2005 | Czubarow et al. |

(Continued)

OTHER PUBLICATIONS

Richard Webb; *Temporary Bonding Enables New Processes Requiring Ultra-Thin Wafers*; Solid State Techology; www.solid-state.com; Feb. 2010; pp. 1-3.

(Continued)

*Primary Examiner* — Peniel M Gumedzoe
*Assistant Examiner* — Christopher Johnson
(74) *Attorney, Agent, or Firm* — Timothy M. Honeycutt

(57) ABSTRACT

Various semiconductor workpieces with selective backside metallizations and methods of making the same are disclosed. In one aspect, a method of manufacturing is provided that includes providing a semiconductor workpiece that has multiple dies. A backside metallization is fabricated on a first die of the dies but not on a second die of the dies.

22 Claims, 9 Drawing Sheets

(56) References Cited

U.S. PATENT DOCUMENTS

| | | |
|---|---|---|
| 2006/0186909 A1 | 8/2006 | Aube et al. |
| 2006/0197210 A1 | 9/2006 | Kim |
| 2008/0001268 A1 | 1/2008 | Lu |
| 2008/0206903 A1* | 8/2008 | Chan .............. G01B 31/318511 438/14 |
| 2009/0091027 A1 | 4/2009 | Fan |
| 2009/0140395 A1* | 6/2009 | Davis .................. H01L 21/6835 257/621 |
| 2010/0003771 A1 | 1/2010 | Nagai et al. |
| 2010/0029045 A1 | 2/2010 | Ramanathan et al. |
| 2012/0043539 A1 | 2/2012 | Prejean et al. |
| 2012/0098119 A1* | 4/2012 | Refai-Ahmed ......... H01L 21/54 257/714 |
| 2013/0307142 A1* | 11/2013 | Lin ......................... H01L 22/20 257/737 |
| 2015/0235969 A1* | 8/2015 | Zhang .................. H01L 23/562 257/620 |
| 2016/0141208 A1* | 5/2016 | Joachim .................. H01L 24/03 438/114 |

OTHER PUBLICATIONS

Saint-Gobain Performance Plastics Corporation; *TF1869 Thermally Conductive Silicone Coated Fabric*; 2007; p. 1.
Saint-Gobain Performance Plastics Corporation; *TF1818 Thermally Conductive Silicone Coated Fabric*; 2005; p. 1.
Saint-Gobain Performance Plastics Corporation; *K271 Thermally Conductive Silicone Coated KAPTON® Tape*; 2005; p. 1.
Electronics Markets Materials Division 3M Electronics; *3M™ Thermal Management Solutions for Electronics*; Sep. 2008; pp. 1-6.

* cited by examiner

SEMICONDUCTOR WORKPIECE WITH SELECTIVE BACKSIDE METALLIZATION

BACKGROUND OF THE INVENTION

1. Field of the Invention

This invention relates generally to semiconductor processing, and more particularly to to semiconductor workpieces or wafers and to methods of application backside metallizations to the same.

2. Description of the Related Art

Conventional semiconductor chips or dies are routinely fabricated en masse in large groups as part of a single semiconductor wafer. At the conclusion of the processing steps to form the individual dies, a so-called dicing or sawing operation is performed on the wafer to cut out the individual dies. Thereafter, the dies may be packaged or directly mounted to a printed circuit board of one form or another.

A typical conventional semiconductor wafer is manufactured with scores or more dies. This fabrication process consists of a large number of manufacturing steps, such as photolithography, ion implants, anneals, etches, chemical and physical vapor deposition and plating to name a few. Significant effort is expended by semiconductor manufacturers toward the goal of achieving nearly identical manufacturing outcomes for the individual semiconductor dies of a wafer. However, inevitable variations in the multitude of processing steps to build the dies leads to performance differences between some or all of the dies of a given wafer. For example, some of dies of a wafer will have relatively higher native clock speeds and power dissipation and some will have lower native clock speeds and power dissipation.

Many types of semiconductor dies dissipate sufficient levels of power such that appropriate thermal management calls for the usage of solder-type thermal interface materials (TIMs) to convey heat from the die to a heat spreader, such as a lid. Silicon typically does not exhibit favorable solder wettable properties. Accordingly, such semiconductor chips, and the wafers that spawn them, frequently include backside structure that may be a unitary or laminate structure of materials that provide a solder wettable interface between the semiconductor chip and the solder-type TIM.

One conventional backside metallization technique involves dedicating a given wafer to a particular application, i.e., to high power parts for use with a lid. The wafer is blanket coated with the backside metallization. However, it may turn out that some of the dies of the wafer ultimately clock out lower than expected in which case the slower dies might be better suited for lidless applications or applications that use organic TIMs. Each of those applications is incompatible with backside metallization. Likewise, there may be current market conditions that favor usage of dies in lidless applications over high power lidded applications. Since the wafer in question has been built with blanket backside metallization, there is no flexibility to go with lidless or organic TIM applications for the slower, lower power dies.

Another conventional wafer fab technique to deal with lidless or organic TIM applications is to fabricate a wafer without any backside metallization. Those dies that natively clock out high and operate with high power consumption are incompatible with solder-type TIMs and so must be used in low power and/or organic TIM applications and possibly with deliberate under clocking.

The present invention is directed to overcoming or reducing the effects of one or more of the foregoing disadvantages.

SUMMARY OF EMBODIMENTS OF THE INVENTION

In accordance with one aspect of an embodiment of the present invention, a method of manufacturing is provided that includes providing a semiconductor workpiece that has multiple dies. A backside metallization is fabricated on a first die of the dies but not on a second die of the dies.

In accordance with another aspect of an embodiment of the present invention, a method of manufacturing is provided that includes providing a semiconductor workpiece that has multiple dies and fabricating a backside metallization on a first die of the dies but not on a second die of the dies. The first die and the second die are singulated.

In accordance with another aspect of an embodiment of the present invention, an apparatus is provided that includes a semiconductor workpiece that has multiple dies, and a backside metallization on a first die of the dies but not on a second die of the dies.

In accordance with another aspect of an embodiment of the present invention, an apparatus is provided that includes a semiconductor workpiece that has multiple dies. A first type of backside metallization is on a first die of the dies and a second type of backside metallization on a second die of the dies.

In accordance with another aspect of an embodiment of the present invention, a method of manufacturing is provided that includes providing a semiconductor workpiece that has multiple dies. A first type of backside metallization is fabricated on a first die of the dies and a second type of a backside metallization is fabricated on a second die of the dies.

BRIEF DESCRIPTION OF THE DRAWINGS

The foregoing and other advantages of the invention will become apparent upon reading the following detailed description and upon reference to the drawings in which.

DETAILED DESCRIPTION OF SPECIFIC EMBODIMENTS

Semiconductor workpieces (such as wafers) manufacture with selective backside metallization fabrication is disclosed. In lieu of dedicating a particular wafer to blanket backside metallization fabrication for high power/clock speed parts and solder thermal interface material plus lid applications, select dies on a wafer may be slated for backside metallization fabrication while others may be slated for applications requiring less demanding thermal solutions and singulated without application of a backside metallization. The selection process may be based on native clock speed, power dissipation or other considerations. The selective backside metallization may be in the form of electrical interconnects as well as purely thermal solutions. Additional details will now be described.

Figure 1:
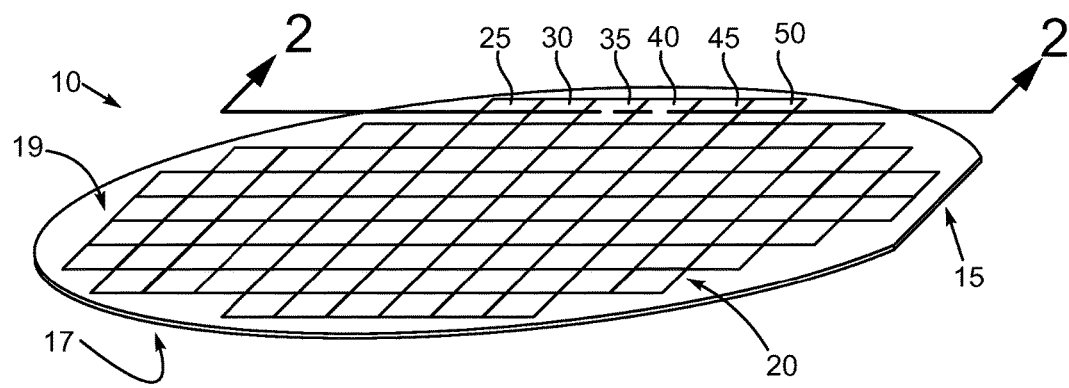
FIG. 1 is a pictorial view of an exemplary embodiment of a semiconductor wafer.

In the drawings described below, reference numerals are generally repeated where identical elements appear in more than one figure. Turning now to the drawings, and in particular to FIG. 1, therein is depicted a pictorial view of an exemplary embodiment of a semiconductor wafer 10. The wafer 10 may have the depicted generally circular shape with one or more flats 15 to facilitate spatial orientation. However, it should be understood that the term wafer as used herein encompasses substrates of virtually any size and shape from which multiple semiconductor dies may be processed and ultimately singulated. Regardless of footprint, the semiconductor wafer 10 includes a front side 17 and a backside 19. The semiconductor wafer 10 is populated by multitudes of semiconductor dies collectively labeled 20. To facilitate the description of exemplary processing of the semiconductor wafer 10, a few of the dies 20 are separately labeled 25, 30, 35, 40, 45 and 50. As described in more detail below, some or all of the dies 20 may be fabricated to include a backside metallization that is not visible in FIG. 1 but will be depicted in subsequent figures. The techniques disclosed herein enable the semiconductor wafer 10 to be processed individually, such that selected of the semiconductor dies 20 or 25, 30, 35, 40, 45 and/or 50 may be fabricated with or without a backside metallization.

Figure 2:
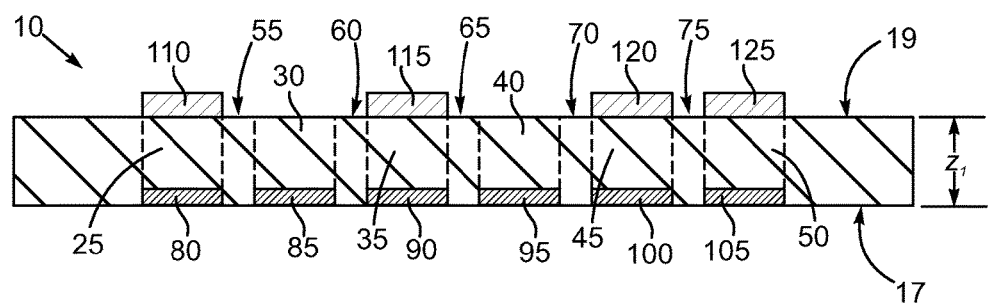
FIG. 2 is a sectional view of FIG. 1 taken at section 2-2 and illustrating several exemplary dies.

Additional details regarding the semiconductor wafer 10 and in particular the dies 25, 30, 35, 40, 45 and 50, thereof may be understood by referring now also to FIG. 2. Before turning to FIG. 2 in detail, it should be noted that FIG. 2 is a sectional view of FIG. 1 taken at section 2-2 and that section 2-2 passes through the semiconductor dies 25, 30, 35, 40, 45 and 50. Note also that FIG. 2 is slightly blown up in size relative to FIG. 1 to enable certain features thereof to be more easily visible. The semiconductor wafer 10 may be composed of a variety of semiconductor materials such as, for example, silicon, germanium, or semiconductor-on-insulator materials, such as, silicon on some type of oxide or other insulating material as desired. The semiconductor wafer 10 depicted in FIG. 2 has undergone a thinning process to be described in more detail below and a selective backside metallization fabrication process again to be described in more detail below. The semiconductor dies 25, 30, 35, 40, 45 and 50 are separated laterally by respective dicing streets 55, 60, 65, 70 and 75, the borders of which are delineated by the dashed lines. The semiconductor dies 25, 30, 35, 40, 45 and 50 include respective circuit portions 80, 85, 90, 95, 100 and 105 fabricated at the wafer front side 17. These circuit portions 80, 85, 90, 95, 100 and 105 may consist of the various circuit structures that make up the integrated circuit(s) of the dies 25, 30, 35, 40, 45 and 50 as well as multiple lines of conductor structures, such as, metallizations and interconnecting vias or other types of conductor structures. It should be understood that the dies 25, 30, 35, 40, 45 and 50 may be virtually any type of integrated circuit. A non-exhaustive list of examples includes integrated circuits dedicated to video processing, central processing units (CPU), graphics processing units (GPU), accelerated processing units (APU) that combines microprocessor and graphics processor functions, a system-on-chip, application specific integrated circuits, memory devices, active optical devices, such as lasers, passive optical devices or the like.

As noted briefly above, the semiconductor wafer 10 may be processed such that some of the semiconductor dies 25, 30, 35, 40, 45 and 50 may be fabricated with backside metallizations at the wafer backside 19 and others without backside metallizations. So for example, the semiconductor dies 25, 35, 45 and 50 may be fabricated with respective backside metallizations 110, 115, 120 and 125 while the semiconductor dies 30 and 40 may be fabricated without such backside metallizations. The backside metallizations 110, 115, 120 and 125 may be constructed as unitary or laminate structures. The types of materials used for the backside metallizations 110, 115, 120 and 125 may be subject to great variety. Exemplary materials include, titanium, gold, silver, copper, titanium, nickel, vanadium, platinum, aluminum, palladium or other types of materials. The selection of materials for the backside metallizations 110, 115, 120 and 125 may depend on whether or not a covering of one form or another will be placed upon the dies 25, 30, 45 and 50 following singulation from the wafer 10, and the composition of any TIM. For example, where solder wettability will be a desirable characteristic for the backside metallizations 110, 115, 120 and 125, the topmost surface should be solder wettable. One example suitable for an indium-based thermal interface material includes, proceeding from top down, a gold film, a nickel-vanadium film, a titanium film and finally an aluminum film. Various deposition processes may be used. For example, aluminum and titanium may be sputtered while nickel-vanadium and gold may be plated.

Figure 3:
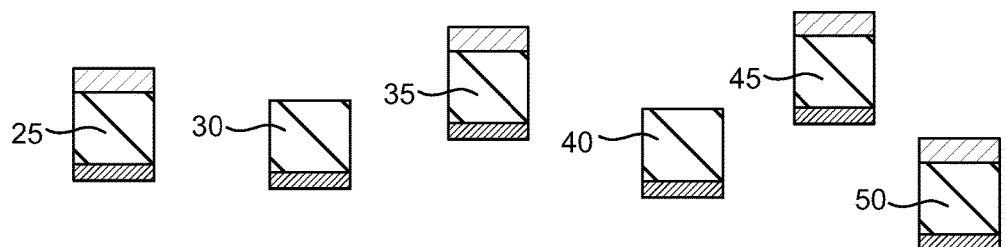
FIG. 3 is a sectional view like FIG. 2 but depicting the multiple dies singulated.

Those dies 30 or 40 not fabricated without a backside metallization may be more suitable for applications that do not require a solder interface with a heat spreader or other structure or where another semiconductor die may be stacked on the dies 30 or 40 in a subsequent circuit board mounting operation. Additional details regarding this selection process will be described below. The semiconductor wafer 10 is depicted in a thinned state in FIGS. 1 and 2, and thus may have some post-thinning process thickness $z_1$ of about 30 to 750 microns. This thickness range and others disclosed herein are merely exemplary. Following singulation, the dies 25, 30, 35, 40, 45 and 50 are separated from the wafer 10 as shown in FIG. 3.

Figure 4:
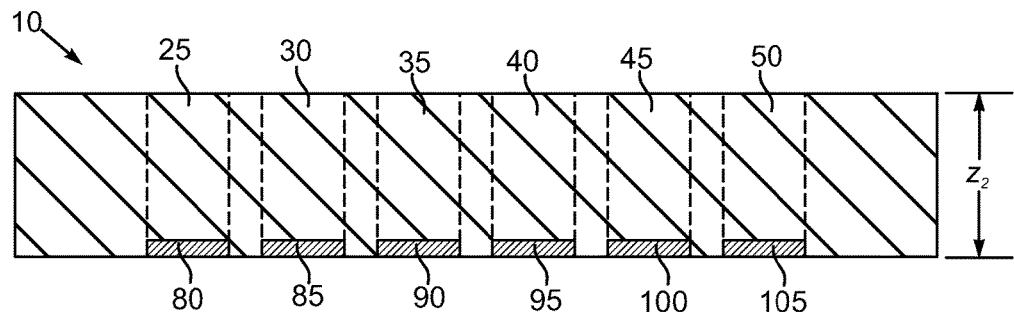
FIG. 4 is a sectional view like FIG. 2 but depicting the exemplary semiconductor wafer 10 prior to thinning.
Figure 5:
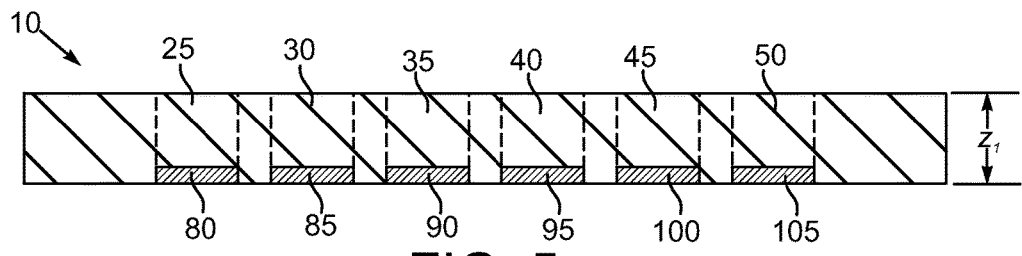
FIG. 5 is a sectional view like FIG. 4 but depicting the post thinning process.
Figure 6:
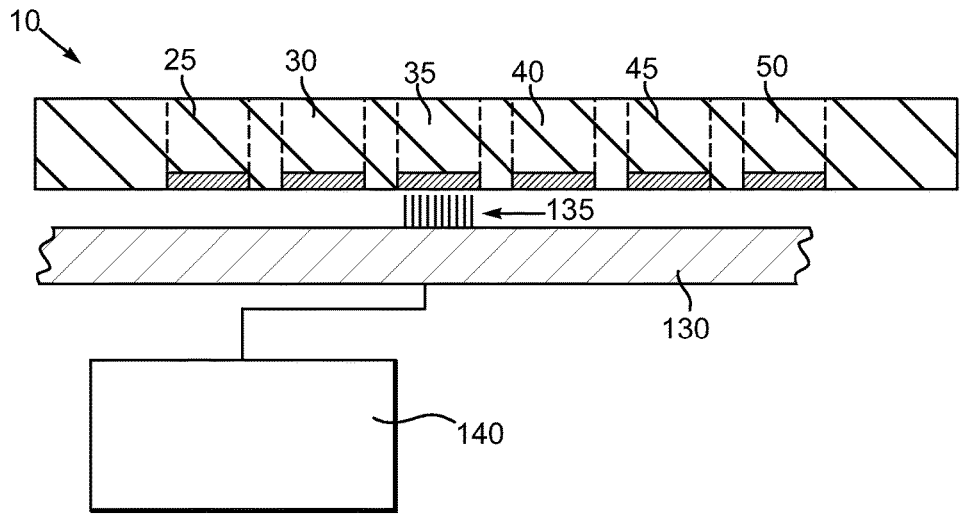
FIG. 6 depicts the semiconductor wafer in section and undergoing electronic testing.

An exemplary method for processing the semiconductor wafer may be understood by referring now to FIGS. 4, 5, 6, 7, 8, 9, 10 and 11 and initially to FIG. 4. FIG. 4 is a sectional view like FIG. 2 but depicting the semiconductor wafer 10 prior to a thinning process and application of any backside metallizations. At this point, the semiconductor wafer 10 may have undergone substantial processing to establish the circuit portions 80, 85, 90, 95, 100 and 105 of the respective semiconductor dies 25, 30, 35, 40, 45 and 50 but the semiconductor wafer 10 has some initial thickness $z_2$ which may be about 1,000 to 2,000 microns. The processing to establish the circuit portions 80, 85, 90, 95, 100 and 105 may be performed using well-known techniques and materials. There may be a carrier wafer and dicing tape (not shown) used for the disclosed processes to protect the wafer 10 as necessary. Next and as depicted in FIG. 5, the semiconductor wafer 10 may undergo a thinning process to reduce the thickness of the semiconductor wafer 10 from $z_2$ down to $z_1$. This thinning process may be performed using a variety of techniques. Examples include lapping, chemical mechanical polishing, chemical etching, combinations of these or the like. Although the semiconductor dies 25, 30, 35, 40, 45 and 50 are typically subjected to theoretically identical process conditions, unavoidable variations in some of the multitude of processing steps taken to create the circuit portions 80, 85, 90, 95, 100 and 105 give rise to variations in the electrical performance of the semiconductor dies 25, 30, 35, 40, 45 and 50. For example, the semiconductor die 25 may have some native clock frequency (maximum clock frequency permitting stable operation without resort to overclocking) of $\omega_1$ while the semiconductor die 30 may have some native clock frequency of $\omega_2$ where $\omega_2 < \omega_1$. Similarly, the semiconductor die 30 may consume less power thus dissipate less heat than the semiconductor die 35. To characterize the individual dies 25, 30, 35, 40, 45 and 50, the semiconductor wafer 10 may undergo a variety of electrical tests which may be termed wafer sorting. As depicted in FIG. 6, the semiconductor wafer 10 may be subjected to probe testing wherein a probe card 130 fitted with plural probe needles 135 may be used to electrically test the various semiconductor dies 25, 30, 35, 40, 45 and 50. The probe needles 135 are connected electrically by way of the probe card 130 to a test instrument 140 which may be a computer or some form of automated test equipment. The skilled artisan will appreciate that tests other than electrical probe tests may be used to test the semiconductor dies 25, 30, 35, 40, 45 and 50, such as devices which exploit induced voltage alterations, such as Thermally Induced Voltage Alteration ("TIVA"), Light Induced Voltage Alteration ("LIVA") and Charge Induced Voltage Alteration ("CIVA"), or a soft defect testing variant that uses a scanning laser microscope to scan over the entire surface of a chip on a pixel-by-pixel basis, and while the laser spot dwells on a given pixel and causes a local perturbation to a circuit, a test computer causes the die to execute a test pattern or script.

Assume for the purposes of this discussion, that the results of the testing of the semiconductor wafer 10 reveals that the semiconductor dies 25, 35, 45 and 50 test out with relatively higher native clock speeds and higher power consumption than the semiconductor dies 30 and 40. Based on this assessment, the semiconductor dies 25, 35, 45 and 50 may be more suitable for ultimate packaging or other circuit board mounting scenarios where high power consumption and heat dissipation techniques are used such as by way of solder thermal interface materials and heat spreaders. In contrast, the semiconductor dies 30 and 40 with their attendant lower power dissipation and native clock speeds may be more suitable for packaging or circuit board mounting applications that do not call for high temperature thermal interface materials and heat spreaders or where 3D stacking may be employed to stack other dies (not shown) on the semiconductor dies 30 and/or 40. Those semiconductor dies 25, 35, 45 and 50 may be targeted for backside metallizations while the semiconductor dies 30 and 40 may not be targeted for backside metallizations.

Figure 7:
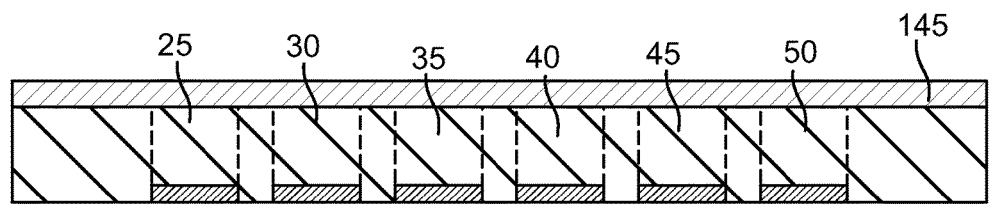
FIG. 7 is a sectional view of the semiconductor wafer undergoing backside metallization application.
Figure 8:
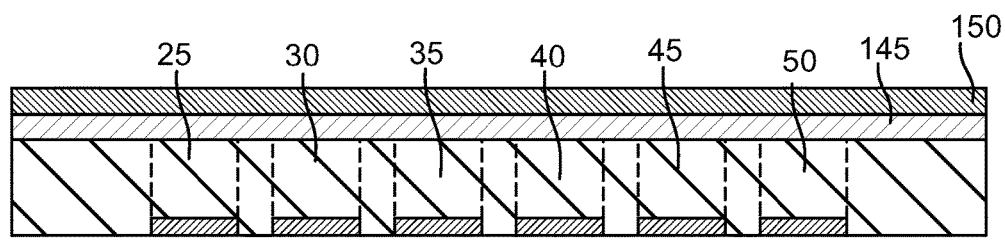
FIG. 8 is a sectional view like FIG. 7 but depicting the application of a masking layer on the backside metallization.
Figure 9:
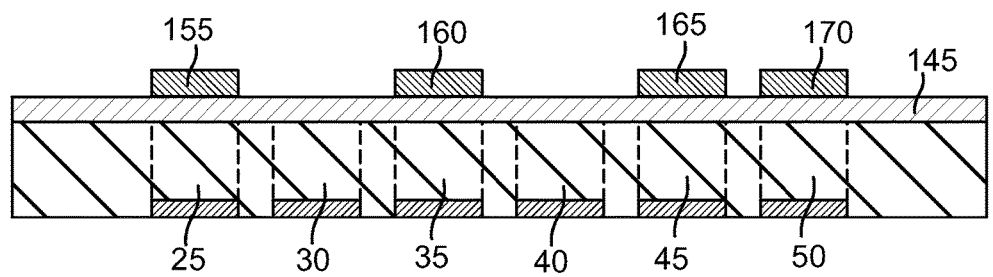
FIG. 9 is a sectional view like FIG. 8 but depicting exemplary patterning of the masking layer.

The backside metallizations may be fabricated on those semiconductor dies 25, 35, 45 and 50 slated for backside metallization using an additive or a subtractive process as desired. For example, and as depicted in FIGS. 7, 8 and 9, the semiconductor wafer 10 may be subjected to one or more metal application processes to establish a backside metallization 145, which may be a unitary layer or a laminate of the materials described elsewhere herein. Various techniques may be used to apply the backside metallization 145 such as physical vapor deposition, chemical vapor deposition, chemical vapor deposition, plating or other techniques. The portions of the backside metallization 145 that overlay the dies 30 and 40 not slated for backside metallization will be removed during subsequent processing. Next and as depicted in FIG. 8, a suitable mask layer 150 may be applied over the backside metallization 145. The mask layer 150 may be composed of well known photoresist materials or be composed of hard mask materials as desired. Next, and as depicted in FIG. 9, the mask layer 150 depicted in FIG. 8, may be patterned to leave mask layer portions 155, 160, 165 and 170 over the portions of the backside metallization 145 associated with the semiconductor dies 25, 35, 45 and 50. However, the portions of the backside metallization 145 over the dies 30 and 40 not slated for backside metallization remain unmasked. This patterning of the mask portions 155, 160, 165 and 170 may be conducted using well known photolithography exposure and development techniques or etching in the event of a hard mask. Note also that either positive tone or negative tone resist may be used for the mask 150 depicted in FIG. 8 if photoresist is utilized.

Figure 10:
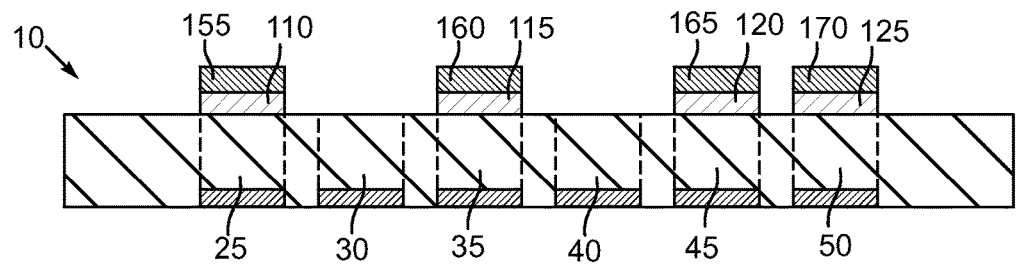
FIG. 10 is a sectional view like FIG. 9 but depicting an exemplary material removal process to pattern individual backside metallization structures.

Next and as depicted in FIG. 10, the backside metallization 145 depicted in FIG. 9 may be subjected to a material removal process to remove those portions that overlay the semiconductor dies 30 and 40 as well as other unmasked portions while leaving the respective backside metallizations 110, 115, 120 and 125 over the semiconductor dies 25, 35, 45 and 50. Well-known dry, directional etching techniques, such as reactive ion etching, using chemistries suitable for the material(s) of the backside metallizations 110, 115, 120 and 125 may be used. Exemplary etchants include $Cl_2$, $CF_4$ with or without $O_2$, $SF_6$ or others. Wet etching may be used as well, with for example HF or phosphoric acid.

Figure 11:
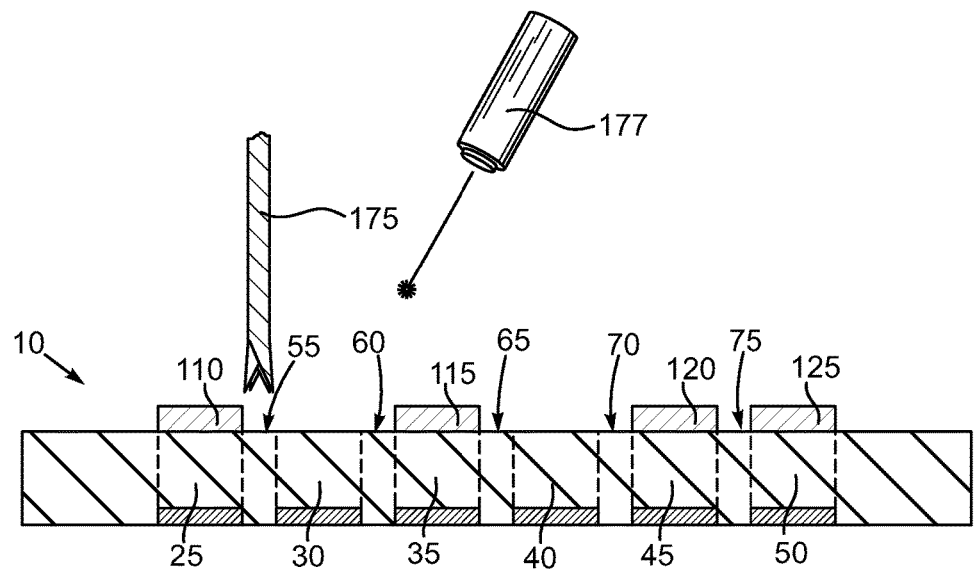
FIG. 11 is a sectional view like FIG. 10 but depicting subsequent mask removal and exemplary singulation.

Next and as depicted in FIG. 11, the mask portions 155, 160, 165 and 170 may be removed by techniques appropriate for the mask material involved such as ashing and solvent stripping or some form of etch process that is tailored not to attack the other structures of the wafer 10. Following the mask removal process, the semiconductor wafer 10 may undergo a dicing operation by way of a mechanical saw 175, a laser cutting tool 177, combinations of the two or other dicing techniques cutting as appropriate at each dicing street 55, 60, 65, 70 and 75 to singulate the semiconductor dies 25, 30, 35, 40, 45 and 50 from the wafer 10.

Figure 12:
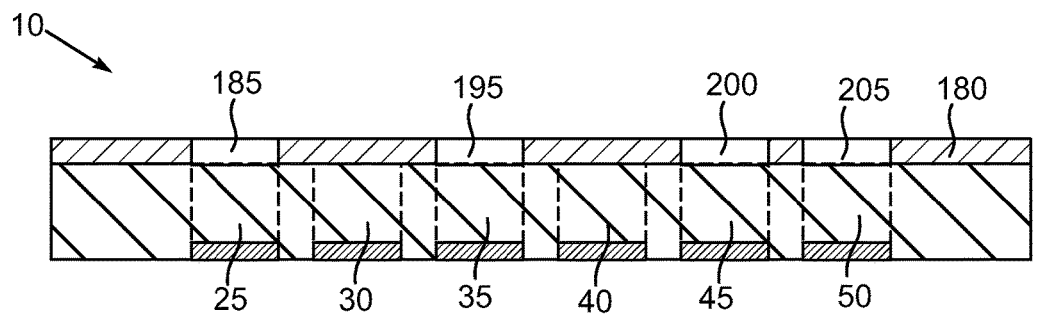
FIG. 12 is a sectional view depicting an exemplary semiconductor wafer and an exemplary masking layer applied thereto.
Figure 13:
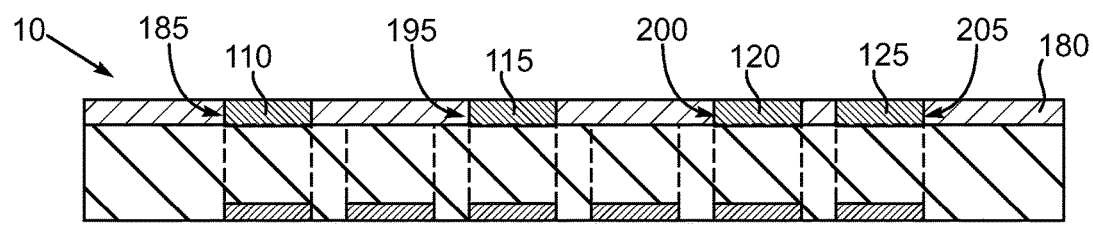
FIG. 13 is a sectional view like FIG. 12 but depicting exemplary material addition to establish individual backside metallization structures.
Figure 14:
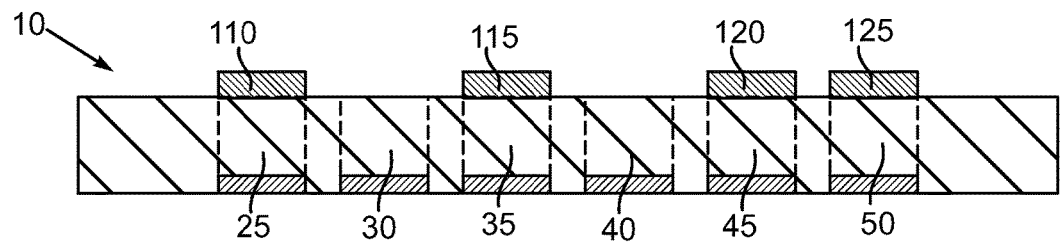
FIG. 14 is a sectional view like FIG. 13 but depicting the removal of the masking layer.

In the foregoing illustrative method, a subtractive process is used to leave the backside metallizations 110, 115, 120 and 125 on the semiconductor dies 25, 35, 45 and 50 and no such backside metallizations on the dies 30 and 40. However, as noted briefly above, an additive process may be alternatively used to establish the backside metallizations 110, 115, 120 and 125. In this regard, attention is now turned to FIGS. 12, 13 and 14. FIG. 12 depicts the semiconductor wafer 10 following the wafer thinning and electrical diagnostic processes disclosed above, such that the semiconductor dies 25, 35, 45 and 50 have been identified as candidates for backside metallization application while the dies 30 and 40 have been identified as candidates to forego backside metallization application. At this stage, the semiconductor wafer 10 may be masked with a suitable mask 180 that includes openings 185, 195, 200 and 205 positioned over the semiconductor dies 25, 35, 45 and 50 respectively. However, the mask 180 covers the semiconductor dies 30 and 40. This mask 180 may be composed of the same types of mask materials disclosed above in conjunction with the first disclosed method. Next, and as depicted in FIG. 13, a material addition process may be performed to fill the openings 185, 195, 200 and 205 with one or more metallic materials to form backside metallizations 110, 115, 120 and 125. Like the alternative method disclosed above, these backside metallizations 110, 115, 120 and 125 may be fabricated using PVD, CVD, plating, or combinations of these or other material application techniques. Again, the mask 180 prevents the application of metal on the backsides of the semiconductor dies 30 and 40. Next and as depicted in FIG. 14, the mask 180 depicted in FIG. 13 may be removed using the above described mask removal techniques to leave the backside metallizations 110, 115, 120 and 125 exposed. At this point, the semiconductor wafer 10 may undergo singulation as described above to singulate the individual dies 25, 30, 35, 40, 45 and 50.

The individualized processing of particular dies of a wafer based on the results of a wafer sort or other diagnostic test may be extended to various types of backside metallizations. In this regard, attention is now turned to FIG. 15, which is a sectional view like FIG. 5, but of a smaller portion of the semiconductor wafer 10 depicted in FIG. 5 such that only the semiconductor dies 25' and 30' of the wafer 10 are visible. Assume for the purposes of this illustration that the results of a wafer sort diagnostic suggest that the semiconductor die 30' has performance characteristics that make it suitable for high performance applications, such as, the ultimate stacking of multiple semiconductor dies 212 and 214 thereon, while the semiconductor die 25' has tested out at a lower performance level relative to the die 30' and thus may not be suitable for a high performance application but perhaps more suitable for the stacking thereon of a single semiconductor die 217. To accommodate the different performance characteristics of, for example, the stack of dies 212 and 214 or the single die 217, the semiconductor dies 25' and 30' may undergo separate customized backside metallization patterning that is appropriate for the particular stacking scheme if any. For example, the semiconductor die 25' may include a group of through silicon vias (TSVs) 219 and a second group of TSVs 221 while the die 30' may also include respective TSV groups 219 and 221. However, because of the relatively lower performance characteristics of the semiconductor die 25', the backside metallization 110' for the die 25' may consist of a large sized conductor pads 223, which may number more than two, and that are ohmically connected to the TSV group 219 and the TSV group 221, respectively. The pads 223 may be suitable to metallurgically bond to solder balls or bumps 229 of the semiconductor die 217. Again, this particular backside metallization interconnect scheme for the die 25' may be tailored according to its testing characteristics. Conversely, the higher performance semiconductor die 30' may instead be processed such that the backside metallization 115' may include plural microbumps 233 that may be suitable to join with corresponding microbumps 236 of the die 212 or serve as the lone interconnect between the die 30' and the die 212 as desired. The electrical interface between the dies 212 and 214 may similarly include plural microbumps 237. Electrical interconnects between the TSV groups 219 and 221 may be provided by way of one or more redistribution layer (RDL) interconnect lines collectively labeled 241, which may be interspersed within an insulating layer 243. It should be understood that the RDL 241 and the insulating layer 243 may consist of a laminate of plural insulating layers and metallization layers as desired. The RDL 241 that may be patterned to provide electrical pathways to the later formed microbumps 233. These particular types of interconnect pathways are merely illustrative of the myriad types of conductor structures that may be incorporated into the dies 25', 30', 212, 214 and 217. Again it should be emphasized that the one type of backside metallization, i.e., the backside metallization 110', may be patterned separately from another type of backside metallization, i.e., the backside metallization 110 or 115'. Furthermore, one or both of the dies 25' and 30' could conceivably test out low enough or otherwise be deemed suitable to not have any backside metallization.

Figure 15:
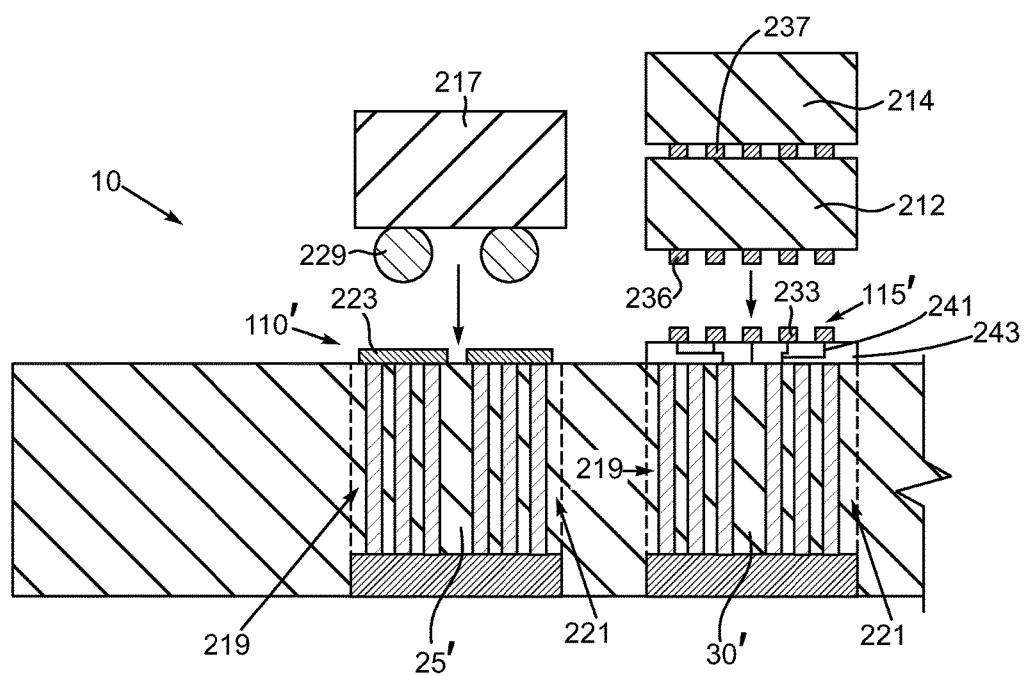
FIG. 15 is a sectional view like FIG. 5 but depicting a smaller portion of an exemplary semiconductor wafer with customized backside metallization.
Figure 16:
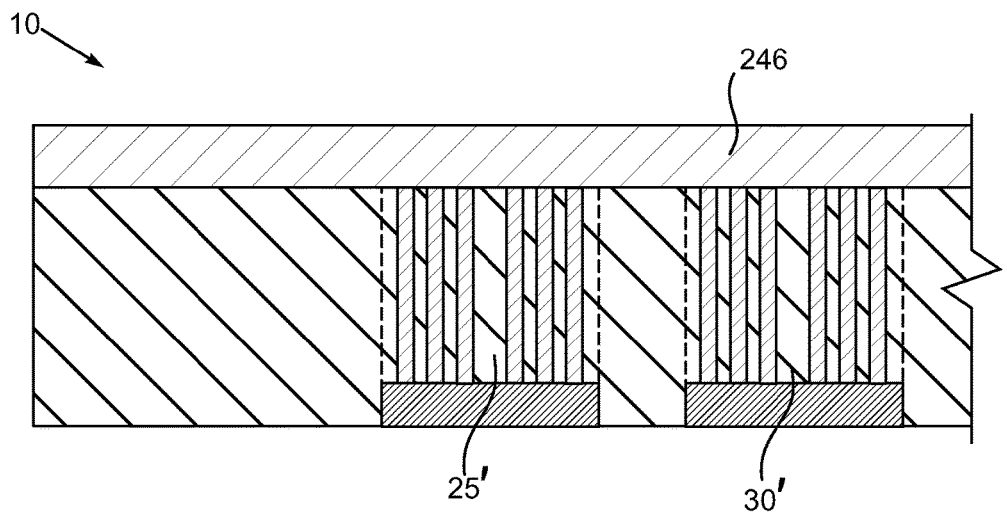
FIG. 16 is a sectional view like FIG. 15 but depicting exemplary masking.
Figure 17:
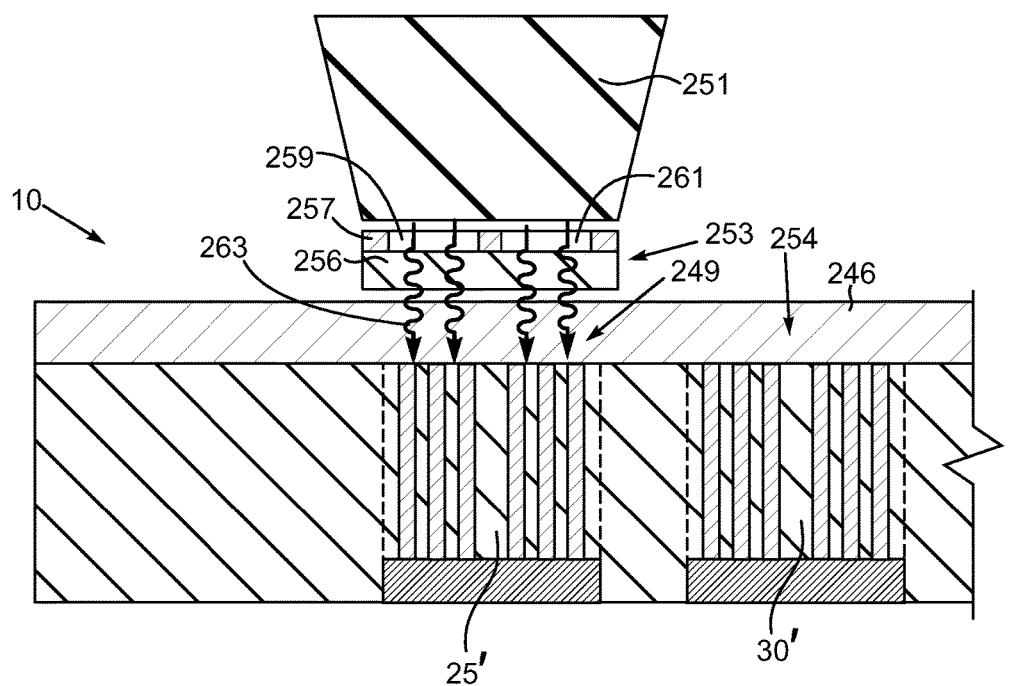
FIG. 17 is a sectional view like FIG. 16 but depicting exemplary selective mask exposure.
Figure 18:
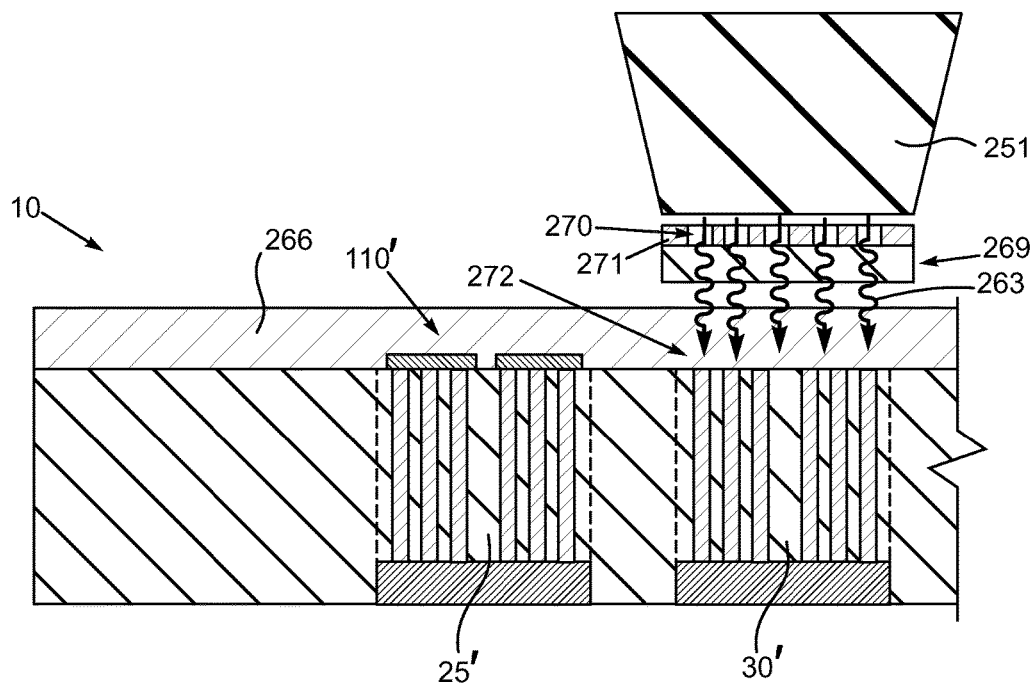
FIG. 18 is a sectional view like FIG. 17 but depicting exemplary selective exposure of a mask over another semiconductor die.

An exemplary method for fabricating the backside metallizations 110' and 115' may be understood by referring now to FIGS. 16, 17 and 18, and initially to FIG. 16 which is a sectional view like FIG. 15. FIG. 16 depicts the semiconductor wafer 10 prior to the selective fabrication of the backside metallizations 110' and 115'. A suitable mask 246 composed of photoresist or other well-known mask materials may be applied to the semiconductor wafer 10 over both the semiconductor dies 25' and 30'. Next, and as depicted in FIG. 17, that portion 249 of the mask 246 over the semiconductor die 25' may be individually exposed by way of a stepper 251. The stepper 251 includes a reticle 253 that has an exposure pattern suitable for fabricating openings in the mask 246 that will facilitate the ultimate fabrication of the pads 223 of the backside metallization 110' shown in FIG. 15. Note, however, that the usage of the stepper 251 provides for the selective exposure of the mask 246 with a particularized pattern and only over the die 25' but without affecting the portion 254 of the mask 246 over the die 30'. The reticle 253 may include a transparent substrate 256 and an opaque layer composed of chrome or other reticle materials that in this case includes multiple openings 259 and 261 to provide for the selective passage of exposure radiation 263. Following the exposure process, the mask 246 may be developed and the backside metallization 110' shown in FIG. 15 may be fabricated using well-known CVD, PVD, plating, etching or other material fabrication techniques while the semiconductor die 30' remains masked.

Subsequently, the mask 246 may be stripped and as shown in FIG. 18, another mask 266 composed of resist or other well-known mask materials may be applied to the semiconductor wafer 10 to not only cover the backside metallization 110' but also both the semiconductor dies 25' and 30'. Next the stepper 251, fitted with another reticle 269 that includes an appropriate pattern of openings 270 and opaque structures 271, is used to selectively expose a portion 272 of the mask 266 to facilitate the subsequent fabrication of the RDL 241 and the insulating substrate 243 shown in FIG. 15. Depending upon the complexity of the backside metallization 115' shown in FIG. 15, there may be multiple masking exposure and development processes as well as intermediary material deposition, plating, etching, etc. processes to fabricate the backside metallization 115'. In any event, these processes associated with the selective backside metallization fabrication for the semiconductor die 30' will not effect the backside metallization 110' for the semiconductor die 25'. Following the steps to create the backside metallization 115', the last mask may be stripped and the dies 25' and 30' may be singulated. The dies 212, 214 and 217 may be stacked thereon as shown in FIG. 15 before or after singulation.

Figure 19:
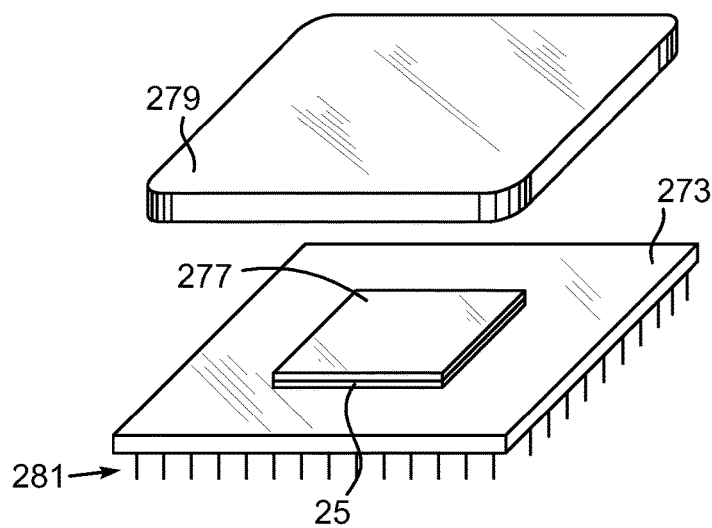
FIG. 19 is a partially exploded pictorial view of an exemplary embodiment of a semiconductor die mounted on a circuit board.
Figure 20:
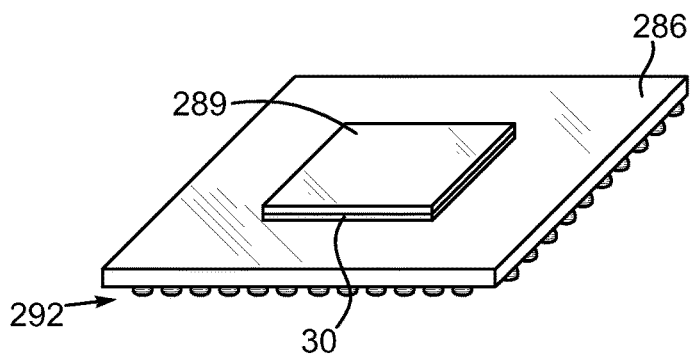
FIG. 20 is a pictorial view of an alternate exemplary die mounted on an alternate exemplary circuit board.
Figure 21:
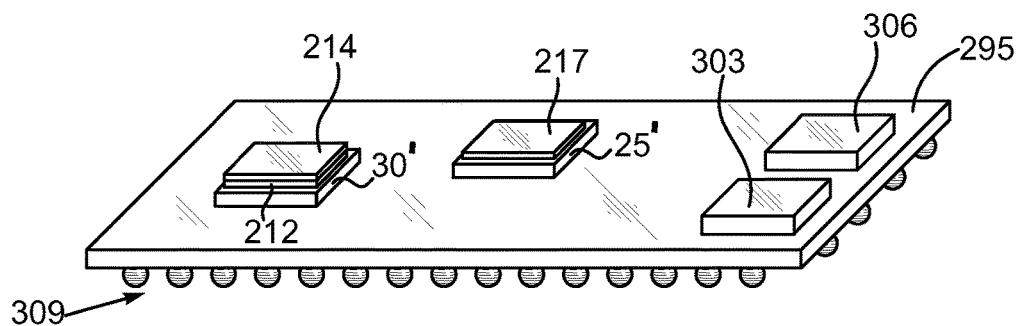
FIG. 21 is a pictorial view of another alternate exemplary die mounted on an interposer with both 3D and 2.5D stacking applications.

As noted above, a given die that is earmarked or not for a backside metallization such as the dies 25 and/or 25' with the backside metallizations 110 and/or 110' may be mounted on a circuit board of one type or another, fitted with a suitable heat spreader or stacked with additional dies. For example, and as depicted in FIG. 19, the die 25 may be mounted to a circuit board 273 in the form of a package substrate or otherwise and a high temperature TIM 277, such as a solder or indium or other type of material, may be applied to the die 25. Thereafter, a heat spreader 279 in the form of a lid or otherwise (shown exploded) may be placed on the circuit board 273 in thermal contact with the thermal interface material 277. Here, the lid 279 is a bathtub configuration, but top hat or other designs could be used. The circuit board 273 may include interconnects, such as the depicted pin grid array 281, but other types of interconnects could be used or omitted. Alternatively and as depicted in FIG. 20, one of the dies, such as the die 30 that is not fabricated with a backside metallization, may be mounted on a circuit board 286 in the form of a package substrate or otherwise and an organic TIM 289 may be applied to the semiconductor die 30. Thereafter some form of heat spreader (not shown) may be placed in thermal contact with the thermal interface material 289. Optionally, the TIM 289 may be omitted altogether and the die 30 used lidless depending upon the level of heat dissipation of the semiconductor die 30. Like the circuit board 273 in FIG. 19, the circuit board 286 may include interconnects, such as the depicted ball grid array 292, or other types. In still another alternative depicted in FIG. 21, one of the semiconductor dies earmarked for high performance 3D stacking, such as the die 30', may be mounted on a circuit board or in this case an interposer 295. The other semiconductor dies 212 and 214 may be stacked on the semiconductor die 30'. The somewhat lower performing die 25' may be mounted on the interposer 295 and the semiconductor die 217 mounted on the semiconductor die 25' in 3D fashion. The interposer 235 could be a semiconductor interposer or a printed circuit board as desired. In addition, 2.5D stacking may be used to mount other semiconductor dies or devices 303 and 306, the number thereof being subject to great variation. Note that the semiconductor dies 303 and 306 could be the product of the selective backside metallization techniques disclosed herein or not. Furthermore, the types of interconnects such as the depicted ball grid array 309 is also subject to great variation as with the other circuit boards depicted in FIGS. 19 and 20.

While the invention may be susceptible to various modifications and alternative forms, specific embodiments have been shown by way of example in the drawings and have been described in detail herein. However, it should be understood that the invention is not intended to be limited to the particular forms disclosed. Rather, the invention is to cover all modifications, equivalents and alternatives falling within the spirit and scope of the invention as defined by the following appended claims.

What is claimed is:

1. A method of manufacturing, comprising:
providing a semiconductor workpiece having multiple full dies; and
fabricating a backside metallization on a first die of the full dies but not on a second die of the full dies.

2. The method of claim 1, wherein the backside metallization comprises a unitary structure.

3. The method of claim 1, wherein the backside metallization comprises a laminate structure.

4. The method of claim 1, comprising selecting the first die to receive the backside metallization and the second die not to receive the backside metallization based on electrical testing of the first die and the second die.

5. The method of claim 1, wherein the fabricating the backside metallization comprises applying the backside metallization over the first die and the second die, masking a portion of the backside metallization over the first die while leaving a portion of the backside metallization of the second die exposed and removing the portion of the backside metallization over the second die.

6. The method of claim 1, wherein the first die dissipates a first power level and the second die dissipates a second power level lower than the first power level.

7. The method of claim 1, wherein the semiconductor workpiece comprises a wafer.

8. The method of claim 4, wherein the electrical testing includes testing to determine power dissipation or native clock speed.

9. A method of manufacturing, comprising:
providing a semiconductor workpiece having multiple full dies;
fabricating a backside metallization on a first die of the full dies but not on a second die of the full dies; and
singulating the first die and the second die.

10. The method of claim 9, comprising mounting the first die on a circuit board.

11. The method of claim 10, comprising placing a heat spreader in thermal contact with the first die.

12. The method of claim 11, wherein the heat spreader comprises a lid.

13. The method of claim 9, comprising mounting the second die on a circuit board.

14. The method of claim 13, comprising stacking another die on the second die.

15. The method of claim 9, comprising electrically testing the first die and the second die and selecting the first die to receive the backside metallization and the second die not to receive the backside metallization based on the electrical testing.

16. The method of claim 15, wherein the electrical testing includes testing to determine power dissipation or native clock speed.

17. The method of claim 9, wherein the first die dissipates a first power level and the second die dissipates a second power level lower than the first power level.

18. The method of claim 9, wherein the semiconductor workpiece comprises a wafer.

19. A method of manufacturing, comprising:
providing a semiconductor workpiece having multiple full dies; and
fabricating a first type of backside metallization on a first die of the full dies and a second type of a backside metallization on a second die of the full dies.

20. The method of claim 19, comprising electrically testing the first die and the second die and selecting the first die to receive the backside metallization and the second die not to receive the backside metallization based on the electrical testing.

21. The method of claim 20, wherein the electrical testing includes testing to determine power dissipation or native clock speed.

22. The method of claim 19, wherein the first die dissipates a first power level and the second die dissipates a second power level lower than the first power level.

* * * * *